US009087869B2

(12) United States Patent
Adam et al.

(10) Patent No.: US 9,087,869 B2
(45) Date of Patent: Jul. 21, 2015

(54) BULK SEMICONDUCTOR FINS WITH SELF-ALIGNED SHALLOW TRENCH ISOLATION STRUCTURES

(71) Applicant: International Business Machines Corporation, Armonk, NY (US)

(72) Inventors: Thomas N. Adam, Slingerlands, NY (US); Kangguo Cheng, Schenectady, NY (US); Ali Khakifirooz, Slingerlands, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 13/900,833

(22) Filed: May 23, 2013

(65) Prior Publication Data

US 2014/0346612 A1    Nov. 27, 2014

(51) Int. Cl.
*H01L 27/092* (2006.01)
*H01L 27/12* (2006.01)
(Continued)

(52) U.S. Cl.
CPC .. *H01L 21/76205* (2013.01); *H01L 21/823821* (2013.01); *H01L 21/845* (2013.01); *H01L 27/0924* (2013.01); *H01L 27/10879* (2013.01); *H01L 27/1211* (2013.01); *H01L 29/0653* (2013.01); *H01L 29/66787* (2013.01); *H01L 29/66795* (2013.01)

(58) Field of Classification Search
CPC ..................... H01L 27/0924; H01L 29/66787; H01L 27/1211; H01L 27/10879; H01L 29/66795; H01L 21/845; H01L 21/823821

USPC ................................ 257/353, 397; 438/164
See application file for complete search history.

(56) References Cited

U.S. PATENT DOCUMENTS 6,642,090 B1    11/2003    Fried et al.
7,056,773 B2    6/2006    Bryant et al.
(Continued)

OTHER PUBLICATIONS

Yamada, I. et al., "Gas Cluster Ion Beam Processing for ULSI Fabrication" J. Material Resources Society Symposium Proceedings (Mar. 1996) pp. 265-274, vol. 427.

(Continued)

*Primary Examiner* — Phat X Cao
(74) *Attorney, Agent, or Firm* — Scully, Scott, Murphy & Presser, P.C.; Yuanmin Cai, Esq.

(57) ABSTRACT

A silicon-carbon alloy layer and a silicon-germanium alloy layer are sequentially formed on a silicon-containing substrate with epitaxial alignment. Trenches are formed in the silicon-germanium alloy layer by an anisotropic etch employing a patterned hard mask layer as an etch mask and the silicon-carbon alloy layer as an etch stop layer. Fin-containing semiconductor material portions are formed on a bottom surface and sidewalls of each trench with epitaxial alignment with the silicon-germanium alloy layer and the silicon-carbon alloy layer. The hard mask layer and the silicon-germanium alloy layer are removed, and an oxygen-impermeable spacer is formed on sidewalls of each fin-containing semiconductor material portion. Physically exposed semiconductor portions are converted into semiconductor oxide portions, and the oxygen-impermeable spacers are removed. The remaining portions of the fin-containing semiconductor portions include semiconductor fins, which can be employed to form semiconductor devices.

18 Claims, 9 Drawing Sheets

(51) Int. Cl.
*H01L 27/108* (2006.01)
*H01L 29/66* (2006.01)
*H01L 21/84* (2006.01)
*H01L 21/8238* (2006.01)
*H01L 21/762* (2006.01)
*H01L 29/06* (2006.01)

(56) References Cited

U.S. PATENT DOCUMENTS

| | | | |
|---|---|---|---|
| 7,888,750 B2 | 2/2011 | Anderson et al. | |
| 7,919,335 B2 | 4/2011 | Xiao et al. | |
| 2007/0020828 A1* | 1/2007 | Hara | 438/164 |
| 2008/0242010 A1* | 10/2008 | Rhee et al. | 438/150 |
| 2009/0057780 A1 | 3/2009 | Wong et al. | |
| 2009/0314963 A1 | 12/2009 | Hautala | |
| 2010/0193898 A1 | 8/2010 | Hautala et al. | |
| 2013/0001591 A1* | 1/2013 | Wu et al. | 257/77 |

OTHER PUBLICATIONS

Wu, C.C. et al., "High performance 22/20nm FinFET CMOS devices with advanced high-K/metal gate scheme" IEEE International Electron Devices Meeting (IEDM) (Dec. 6-8, 2010) pp. 27.1.1-27.1.4.

Redolfi, A. et al., "Bulk FinFET fabrication with new approaches for oxide topography control using dry removal techniques" 12th International Conference on Ultimate Integration on Silicon (ULIS) (Mar. 14-16, 2011) 3 pages.

* cited by examiner

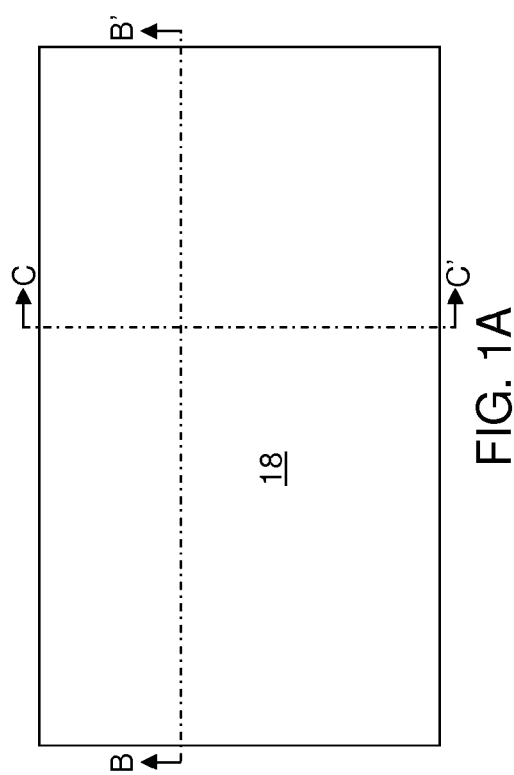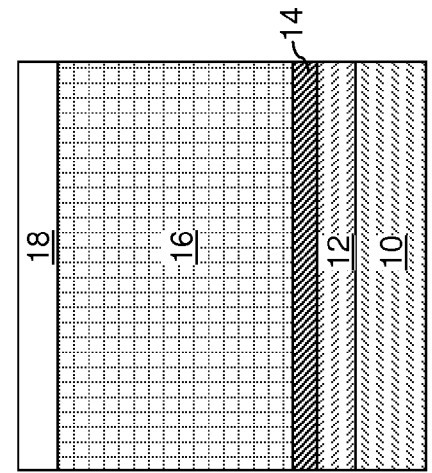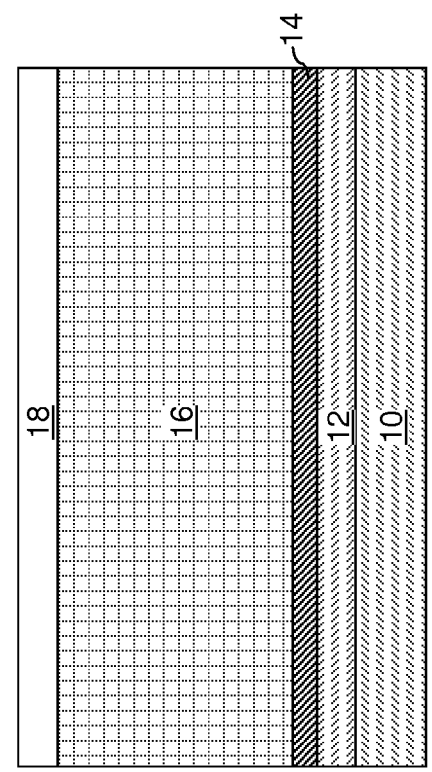

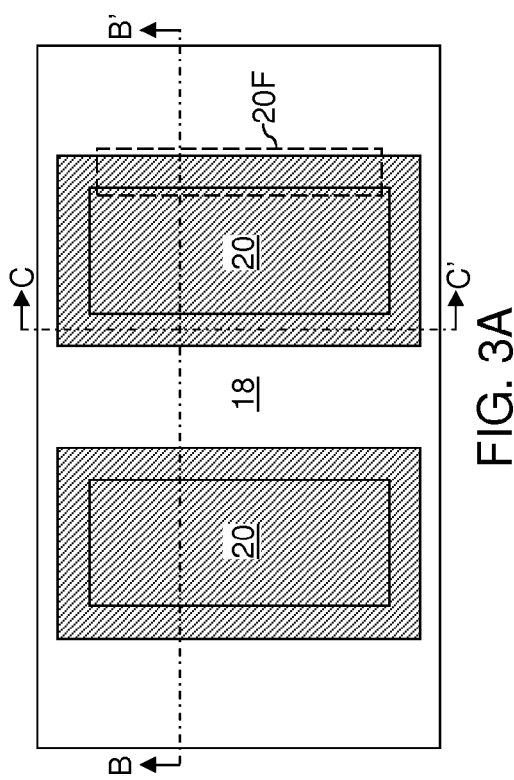
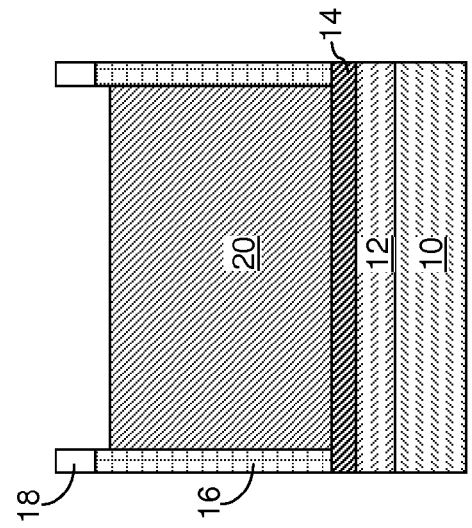
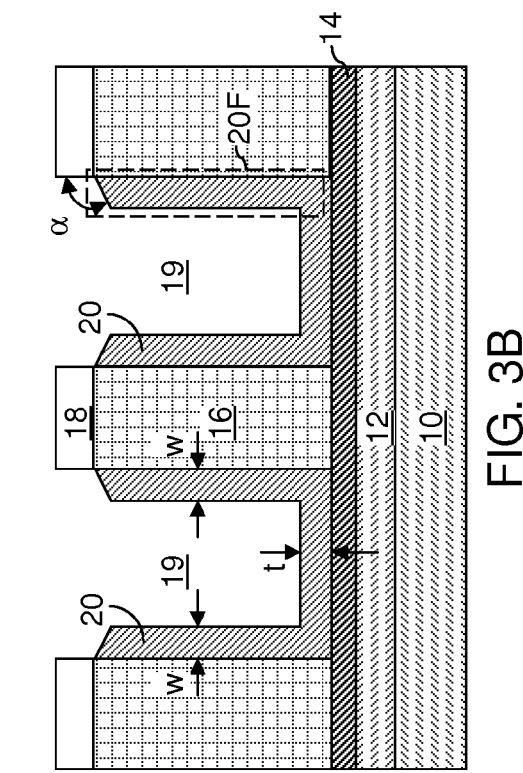

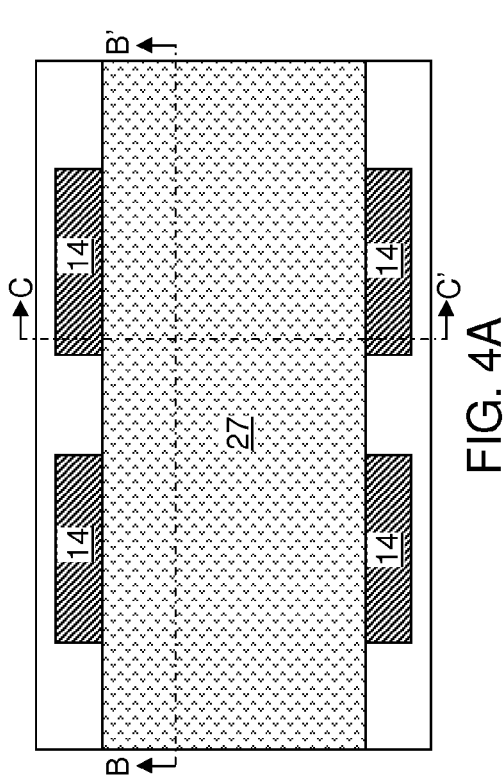
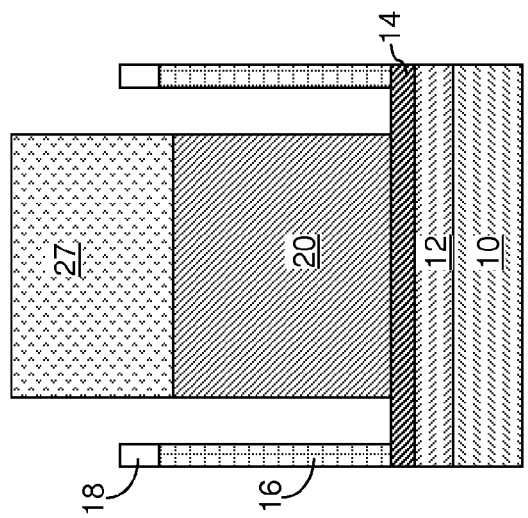
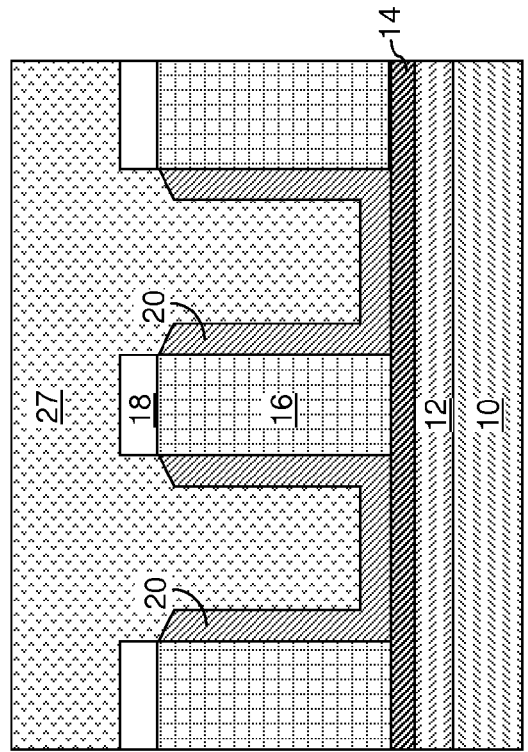
FIG. 4A
FIG. 4C
FIG. 4B

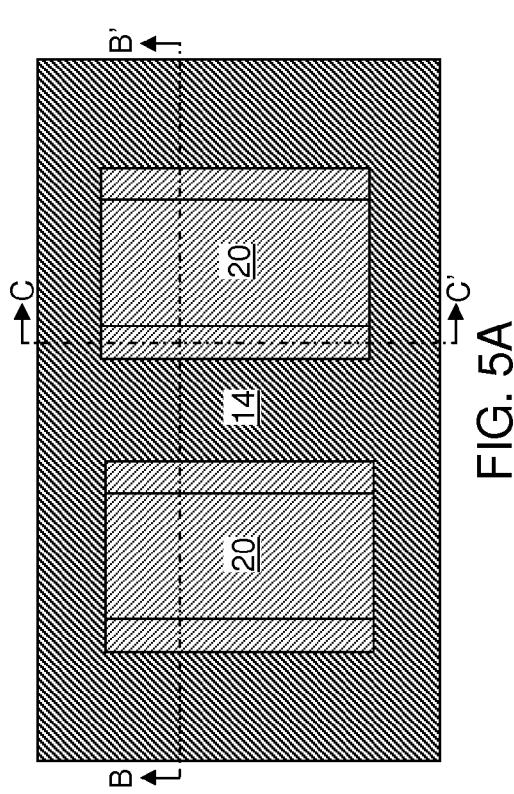
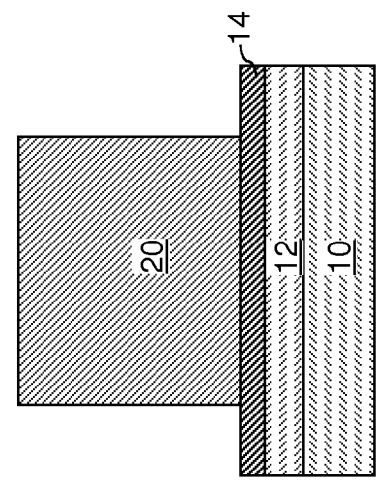
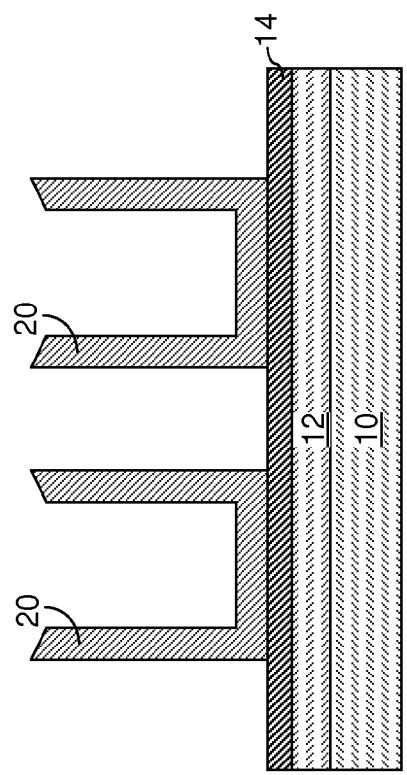

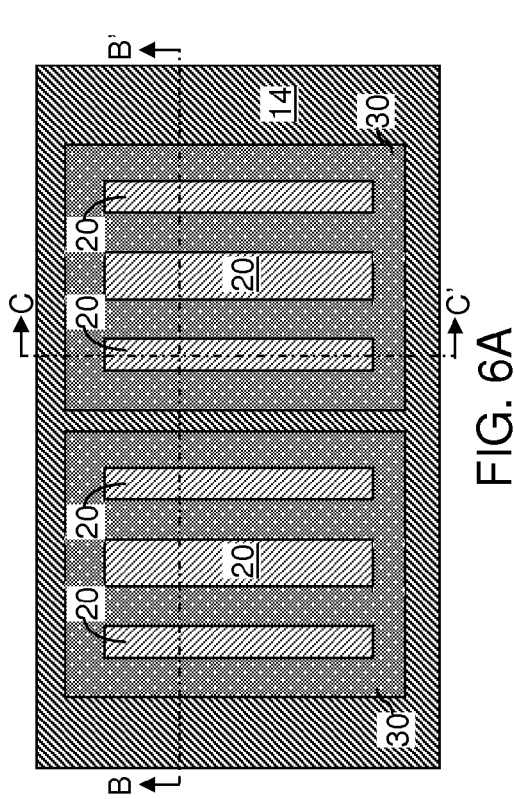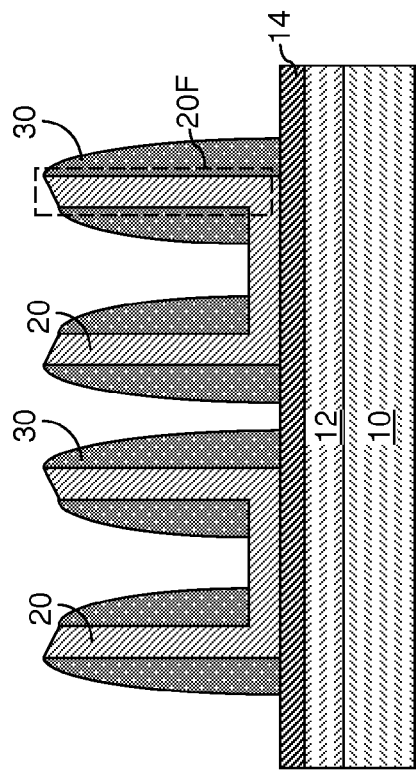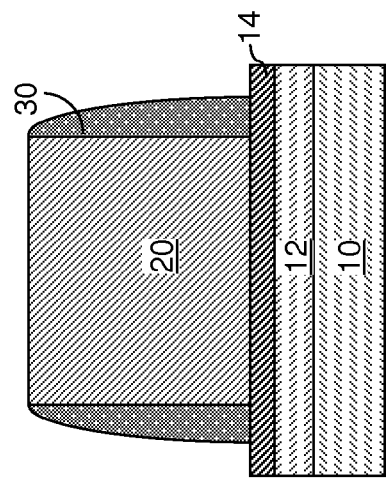
FIG. 6A
FIG. 6B
FIG. 6C

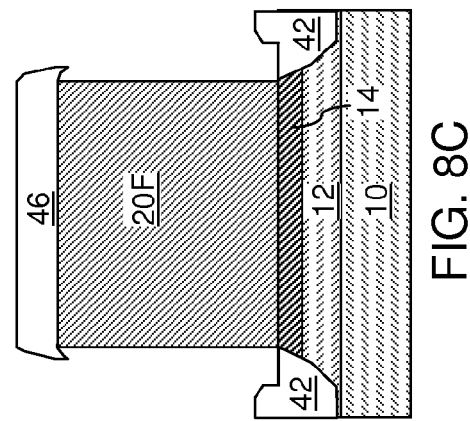
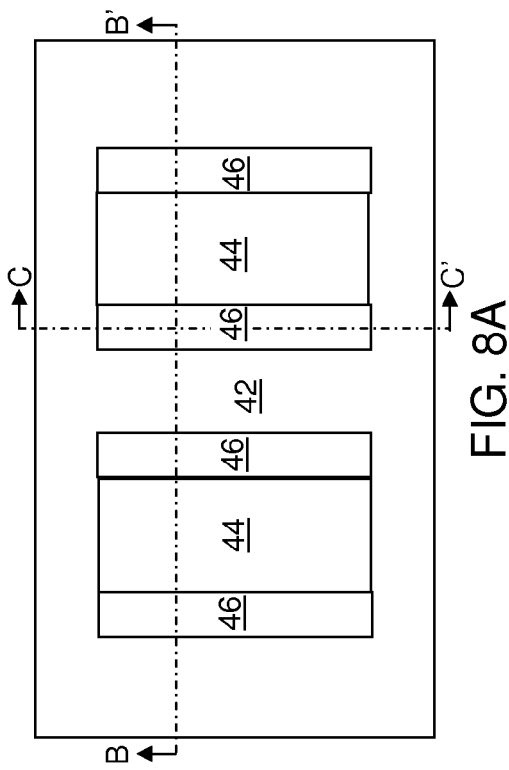
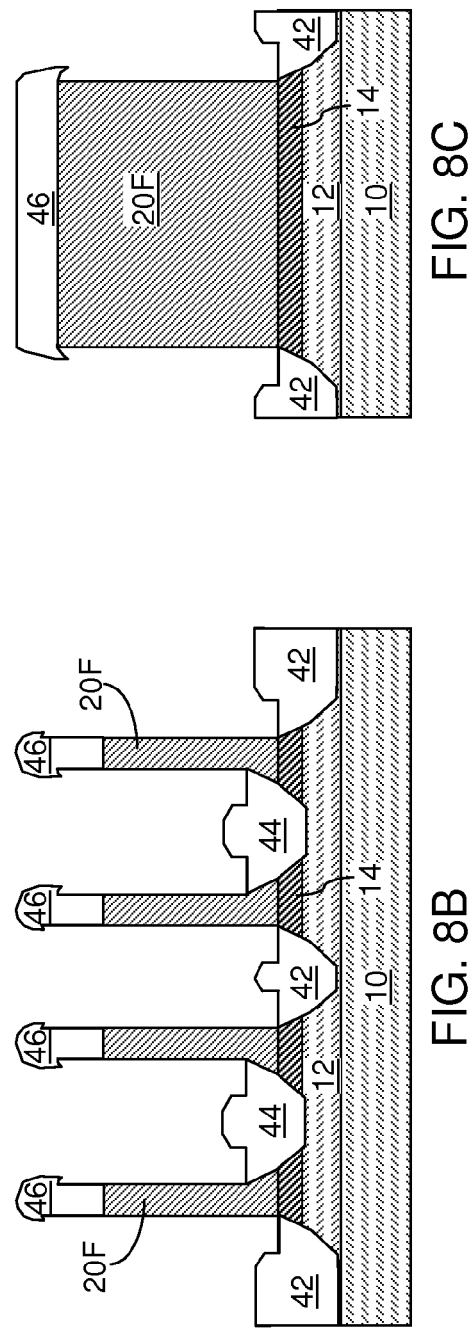

_US 9,087,869 B2_

BULK SEMICONDUCTOR FINS WITH SELF-ALIGNED SHALLOW TRENCH ISOLATION STRUCTURES

BACKGROUND

The present disclosure relates to semiconductor structures, and particularly to bulk semiconductor fins with self-aligned shallow trench isolation structures and a method of manufacturing the same.

Semiconductor fins formed on a bulk substrate as known in the art suffer from height variations caused by the variations in the recess depth of shallow trench isolation structures. Further, the profiles of the semiconductor fins can vary due to variations in the profile of mandrel structures and/or tapers introduced in the anisotropic etch process employed to pattern the semiconductor fins. In addition, channel dopant contamination can occur due to a punchthrough stopper implantation process, which causes implanted ions to pass through channel regions during the implantation process.

SUMMARY

A silicon-carbon alloy layer and a silicon-germanium alloy layer are sequentially formed on a silicon-containing substrate with epitaxial alignment. A patterned hard mask layer is formed over the silicon-germanium alloy layer. Trenches are formed in the silicon-germanium alloy layer by an anisotropic etch employing the patterned hard mask layer as an etch mask and the silicon-carbon alloy layer as an etch stop layer. Fin-containing semiconductor material portions are formed on a bottom surface and sidewalls of each trench with epitaxial alignment with the silicon-germanium alloy layer and the silicon-carbon alloy layer. The hard mask layer and the silicon-germanium alloy layer are removed, and an oxygen-impermeable spacer is formed on sidewalls of each fin-containing semiconductor material portion. Physically exposed semiconductor portions are converted into semiconductor oxide portions, and the oxygen-impermeable spacers are removed. The remaining portions of the fin-containing semiconductor portions include semiconductor fins, which can be employed to form semiconductor devices.

According to an aspect of the present disclosure, a semiconductor structure is provided, which includes a silicon-carbon alloy layer located on a semiconductor substrate, and a silicon-containing semiconductor fin located on the silicon-carbon alloy layer. The silicon-containing semiconductor fin and the silicon-carbon alloy layer are single crystalline and in epitaxial alignment with each other. The semiconductor structure further includes a shallow trench isolation structure contacting the silicon-containing semiconductor fin and the silicon-carbon alloy layer and including an oxide of a silicon-containing semiconductor material in an upper portion thereof.

According to another aspect of the present disclosure, a method of forming a semiconductor structure is provided. A stack, from bottom to top, of a single crystalline silicon-germanium alloy layer and a hard mask layer over a substrate is formed. A trench is formed within the single crystalline silicon-germanium alloy layer. A silicon-containing material portion is formed by selectively depositing a silicon-containing semiconductor material on sidewall surfaces of the single crystalline silicon-germanium alloy layer within the trench. The hard mask layer and the single-crystalline silicon-germanium alloy layer are removed selective to the silicon-containing material portion and the substrate. The silicon-containing material portion includes at least one semiconductor fin.

BRIEF DESCRIPTION OF SEVERAL VIEWS OF THE DRAWINGS

FIG. 1A is a top-down view of an exemplary semiconductor structure after formation of a punchthrough stopper doping layer, a silicon-carbon alloy layer, a silicon-germanium alloy layer, and a hard mask layer according to an embodiment of the present disclosure.

FIG. 1B is a vertical cross-sectional view of the exemplary semiconductor structure along the vertical plane B-B' of FIG. 1A.

FIG. 1C is a vertical cross-sectional view of the exemplary semiconductor structure along the vertical plane C-C' of FIG. 1A.

FIG. 3A is a top-down view of the exemplary semiconductor structure after formation of fin-containing semiconductor material portions according to an embodiment of the present disclosure.

FIG. 3B is a vertical cross-sectional view of the exemplary semiconductor structure along the vertical plane B-B' of FIG. 3A.

FIG. 3C is a vertical cross-sectional view of the exemplary semiconductor structure along the vertical plane C-C' of FIG. 3A.

FIG. 4A is a top-down view of the exemplary semiconductor structure after optional removal of end portions of the fin-containing semiconductor material portions according to an embodiment of the present disclosure.

FIG. 4B is a vertical cross-sectional view of the exemplary semiconductor structure along the vertical plane B-B' of FIG. 4A.

FIG. 4C is a vertical cross-sectional view of the exemplary semiconductor structure along the vertical plane C-C' of FIG. 4A.

FIG. 5A is a top-down view of the exemplary semiconductor structure after removal of the hard mask layer and the silicon-germanium alloy layer according to an embodiment of the present disclosure.

FIG. 5B is a vertical cross-sectional view of the exemplary semiconductor structure along the vertical plane B-B' of FIG. 5A.

FIG. 5C is a vertical cross-sectional view of the exemplary semiconductor structure along the vertical plane C-C' of FIG. 5A.

FIG. 6A is a top-down view of the exemplary semiconductor structure after formation of dielectric spacers according to an embodiment of the present disclosure.

FIG. 6B is a vertical cross-sectional view of the exemplary semiconductor structure along the vertical plane B-B' of FIG. 6A.

FIG. 6C is a vertical cross-sectional view of the exemplary semiconductor structure along the vertical plane C-C' of FIG. 6A.

FIG. 8A is a top-down view of the exemplary semiconductor structure after removal of dielectric spacers selective to semiconductor materials and semiconductor oxide portions according to an embodiment of the present disclosure.

FIG. 8B is a vertical cross-sectional view of the exemplary semiconductor structure along the vertical plane B-B' of FIG. 8A.

FIG. 8C is a vertical cross-sectional view of the exemplary semiconductor structure along the vertical plane C-C' of FIG. 8A.

DETAILED DESCRIPTION

Figure 2A:
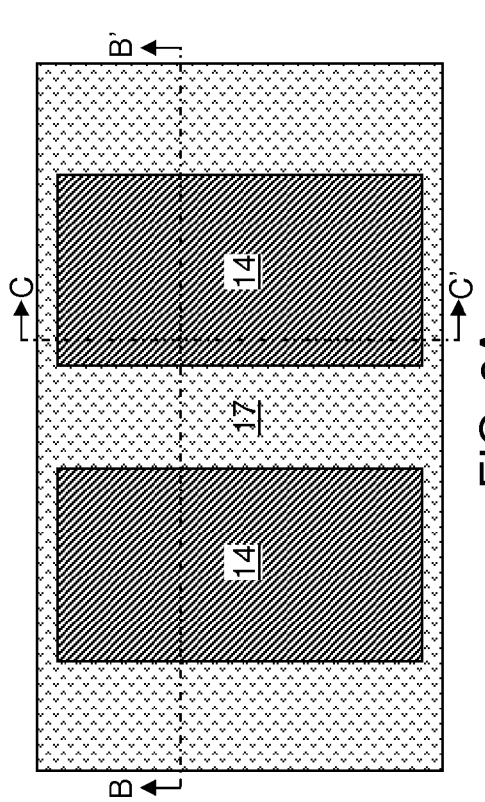
FIG. 2A is a top-down view of the exemplary semiconductor structure after formation of trenches through the hard mask layer and the silicon-germanium alloy layer according to an embodiment of the present disclosure.

As stated above, the present disclosure relates to bulk semiconductor fins with self-aligned shallow trench isolation structures and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A-1C, an exemplary semiconductor structure according to an embodiment of the present disclosure includes a substrate including a semiconductor substrate layer 10. The semiconductor substrate layer 10 can be a bulk semiconductor substrate as known in the art. In one embodiment, the semiconductor substrate layer 10 can include a single crystalline semiconductor material such as single crystalline silicon or a single crystalline silicon-germanium alloy. The semiconductor substrate layer 10 can be intrinsic, or can be doped with p-type dopants or n-type dopants. If doped, the semiconductor substrate layer 10 can have a dopant concentration in a range from $1.0\times10^{14}/cm^3$ to $1.0\times10^{17}/cm^3$, although lesser and greater dopant concentrations can also be employed. In one embodiment, different portions of the semiconductor substrate layer 10 can be doped with dopants of different conductivity types.

Optionally, a punchthrough stopper doping layer 12 can be formed on a top surface of the semiconductor substrate layer 10. The punchthrough stopper doping layer 12 has a p-type doping or an n-type doping. The portion of the semiconductor substrate layer 10 underlying the punchthrough stopper doping layer 12 can be intrinsic, or can have a doping of the same or different conductivity type as the doping of the punchthrough stopper doping layer. The dopant concentration of the punchthrough stopper doping layer 12 can be greater than the dopant concentration of the semiconductor substrate layer 10, and can be in a range from $1.0\times10^{17}/cm^3$ to $5.0\times10^{18}/cm^3$, although lesser and greater dopant concentrations can also be employed.

The punchthrough stopper doping layer 12 can be formed by conversion of an upper portion of the semiconductor substrate layer 10 into the punchthrough stopper doping layer 12 by ion implantation, or can be formed by epitaxy of a doped semiconductor material on the top surface of the semiconductor substrate layer 10. In one embodiment, the punchthrough stopper doping layer 12 can include a doped single crystalline silicon material or a doped single crystalline silicon-germanium alloy material. The thickness of the punchthrough stopper doping layer 12 can be in a range from 3 nm to 200 nm, although lesser and greater thicknesses can also be employed. The stack of the semiconductor substrate layer 10 and the punchthrough stopper doping layer 12 can collectively constitute a semiconductor substrate (10, 12).

A silicon-carbon alloy layer 14 can be formed over the punchthrough stopper doping layer 12. The silicon-carbon alloy layer 14 includes a single crystalline silicon-carbon alloy material that is epitaxially aligned to the single crystalline semiconductor materials in the punchthrough stopper doping layer 12 and the substrate semiconductor layer 10. In one embodiment, the single crystalline silicon-carbon alloy material includes carbon at an atomic concentration in a range from 0.1% to 2.0%, at least one optional electrical dopant element having a same conductivity type as the doping of the underlying punchthrough stopper doping layer 12, and silicon as the balance material, i.e., the material constituting the remainder of the composition. If doped, the dopant concentration of the p-type or n-type dopants in the silicon-carbon alloy layer 14 can be in a range from $1.0\times10^{14}/cm^3$ to $1.0\times10^{18}/cm^3$, although lesser and greater dopant concentrations can also be employed.

The silicon-carbon alloy layer 14 can be formed by conversion of an upper portion of the punchthrough stopper doping layer 12 into the silicon-carbon alloy layer by ion implantation, or the silicon-carbon alloy layer 14 can be formed by epitaxy of a doped or undoped silicon-carbon alloy material on the top surface of the punchthrough stopper doping layer 12. In one embodiment, the silicon-carbon alloy layer 14 can include a doped or intrinsic single crystalline silicon-carbon material. The thickness of the silicon-carbon alloy layer 14 can be in a range from 3 nm to 50 nm, although lesser and greater thicknesses can also be employed.

A silicon-germanium alloy layer 16 can be formed over the silicon-carbon alloy layer 14. The silicon-germanium alloy layer 16 includes a single crystalline silicon-germanium alloy material that is epitaxially aligned to the single crystalline semiconductor materials in the silicon-carbon alloy layer 14, the punchthrough stopper doping layer 12, and the substrate semiconductor layer 10. In one embodiment, the single crystalline silicon-germanium alloy material includes germanium at an atomic concentration in a range from 25% to 80% and silicon as the balance material.

The silicon-germanium alloy layer 16 can be formed by epitaxy of a silicon-germanium alloy material on the top surface of the silicon-carbon alloy layer 14. The thickness of the silicon-germanium alloy layer 16 can be in a range from 30 nm to 300 nm, although lesser and greater thicknesses can also be employed.

A hard mask layer 18 can be deposited over the top surface of the silicon-germanium alloy layer 16. The hard mask layer 18 includes a dielectric material, which can be silicon oxide, silicon nitride, silicon oxynitride, a dielectric metal oxide, a dielectric metal nitride, a dielectric metal oxynitride, or a combination thereof. The thickness of the hard mask layer 18 can be in a range from 10 nm to 100 nm, although lesser and greater thicknesses can also be employed.

Figure 2C:
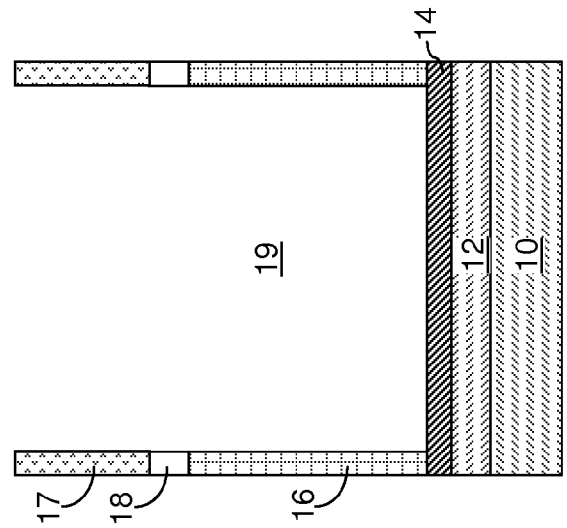
FIG. 2C is a vertical cross-sectional view of the exemplary semiconductor structure along the vertical plane C-C' of FIG. 2A.
Figure 2B:
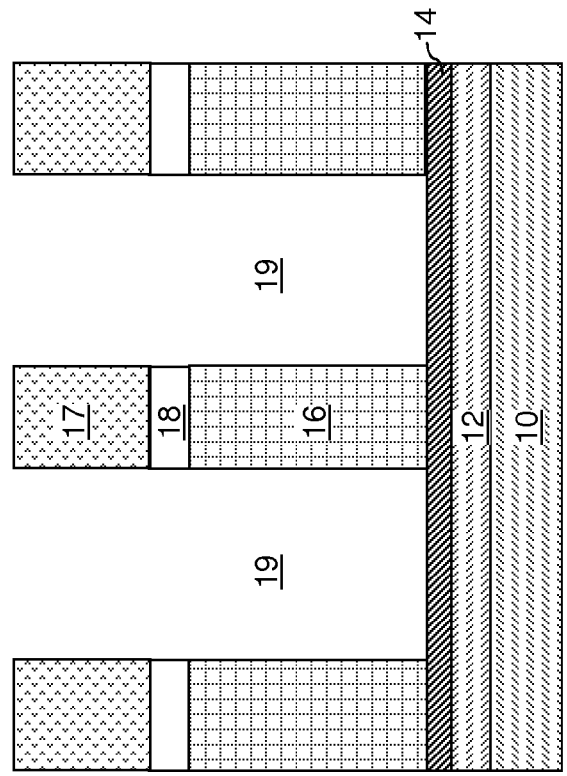
FIG. 2B is a vertical cross-sectional view of the exemplary semiconductor structure along the vertical plane B-B' of FIG. 2A.

Referring to FIGS. 2A-2C, a first photoresist layer 17 can be applied over the hard mask layer 18. The first photoresist layer 17 can be lithographically patterned to form openings therein. In one embodiment, each opening can have a pair of parallel sidewalls. Each pair of parallel sidewalls can be, for example, perpendicular to the vertical plane B-B', and parallel to the vertical plane C-C', in FIG. 2A.

The pattern in the first photoresist layer 17 can be transferred into the hard mask layer 18 and the silicon-germanium alloy layer 16 by at least one anisotropic etch. The etch chemistry for anisotropically etching the silicon-germanium alloy layer 16 can be selective to the silicon-carbon alloy material in the silicon-carbon alloy layer 14. Thus, the silicon-carbon alloy layer 14 can be employed as an etch stop layer for the anisotropic etch process that removes physically exposed portions of the silicon-germanium alloy layer 16. In another embodiment, carbon in the silicon-carbon alloy layer 14 can be used as the endpoint signal to once the silicon-germanium alloy layer 16 is etched and the underlying silicon-carbon alloy layer 14 is exposed. Besides lithography, other patterning techniques such as sidewall imaging transfer (SIT) can be used to pattern the silicon-germanium alloy layer 16.

A cavity 19 can be formed underneath each opening in the first photoresist layer 17 such that a horizontal cross-sectional shape of each cavity 19 is substantially the same as the horizontal cross-sectional shape of an overlying opening in the hard mask layer 18. As used herein, a first shape is substantially the same as the second shape if the difference between the first shape and the second shape is non-existent or a uniform lateral offset distance that is the same between each pair of corresponding points between the first shape and the second shape and does not exceed 10 nm in magnitude. Alternatively, the cavity 19 formed underneath each opening can have different lateral dimensions. In one embodiment, the sidewalls of the cavities 19 can be vertical. In one embodiment, each cavity 19 can include a pair of vertical sidewalls of the silicon-germanium alloy layer 16, which can be, for example, perpendicular to the vertical plane B-B', and parallel to the vertical plane C-C', in FIG. 2A. A top surface of the silicon-carbon alloy layer 14 is physically exposed at a bottom of each trench 19. The first photoresist layer 17 is subsequently removed, for example, by ashing.

Referring to FIGS. 3A-3C, silicon-containing material portions 20 can be formed directly on the sidewalls of the silicon-germanium alloy layer 16 and the physically exposed portions of the silicon-carbon alloy layer 14. The silicon-containing material portions 20 include a single crystalline semiconductor material that contains silicon. In one embodiment, the silicon-containing material portions 20 can include intrinsic single crystalline silicon, p-doped single crystalline silicon, or n-doped single crystalline silicon. In another embodiment, the silicon-containing material portions 20 can include a single crystalline silicon-carbon alloy, a single crystalline silicon-germanium alloy in which the atomic concentration of germanium is less than the atomic concentration of germanium in the silicon-germanium alloy layer 16. Preferably, the difference of atomic concentration of germanium in the silicon-containing material portion 20 and the silicon-germanium alloy layer 16 is greater than 20% so that the silicon-germanium alloy layer 16 can be removed selectively to the silicon-containing material portion 20. For example, the Ge % in the layer 16 can be 50% and the Ge % in material 20 can be 25%. In one embodiment, the silicon-containing material portions 20 can include a single crystalline silicon-carbon-germanium alloy in which the atomic concentration of germanium is less than 30%. In one embodiment, the atomic concentration of germanium in the silicon-containing material portions 20 is in a range from 0% to 40%. In another embodiment, the atomic concentration of germanium in the silicon-containing material portions 20 is in a range from 0% to 10%. In yet another embodiment, the silicon-containing material portions 20 are substantially free of germanium. As used herein, a material is "substantially free of" an element if the atomic concentration of the element is at a trace level, i.e., less than 1 part per million (p.p.m.). In one embodiment, the silicon-containing material portions 20 can be substantially free of carbon, or includes carbon at an atomic concentration that is less than 50% of the atomic concentration of carbon in the silicon-carbon alloy layer 14. In another embodiment, the atomic concentration of carbon in the silicon-containing material portions 20 can be less than 10% of the atomic concentration of carbon in the silicon-carbon alloy layer 14.

The silicon-containing material portions 20 can be formed employing a selective epitaxy process. During the selective epitaxy process, a single crystalline silicon-containing semiconductor material can be deposited on semiconductor surfaces selective to dielectric surfaces. In other words, the single crystalline silicon-containing semiconductor material grows from semiconductor surfaces while the single crystalline silicon-containing semiconductor material does not grow from dielectric surfaces.

Each silicon-containing material portion 20 includes a horizontal portion that grows from a physically exposed portion of the top surface the silicon-carbon alloy layer 14 and vertical portions that grow from sidewalls of the silicon-germanium alloy layer 16. The horizontal portion is deposited with epitaxial alignment with the silicon-carbon alloy layer 14, and the vertical portions are deposited with epitaxial alignment with the silicon-germanium alloy layer 16. At least one vertical portion of each silicon-containing material portion 20 can have a pair of parallel sidewalls laterally spaced by a uniform width. As used herein, a semiconductor fin refers to a semiconductor material portion having a pair of parallel sidewalls laterally spaced by a uniform width. Thus, each silicon-containing material portion 20 can include at least one semiconductor fin 20F. As such, each silicon-containing material portion 20 is a fin-containing semiconductor material portion. Each silicon-containing material portion 20 includes a horizontal portion in contact with the silicon-carbon alloy layer 14 and vertical portions in contact with sidewalls of the single crystalline silicon-germanium alloy layer 16.

The width of semiconductor fins within each silicon-containing material portion 20 can be the same, and is herein referred to as a fin width w. The fin width w can be in a range from 3 nm to 100 nm, although lesser and greater fin widths can also be employed. The thickness t of the horizontal portions of the silicon-containing material portions 20 may be the same as, or different from, the fin width w. In one embodiment, the thickness t of the horizontal portions of the silicon-containing material portions 20 is the same as the fin width w. In another embodiment, the thickness t of the horizontal portions of the silicon-containing material portions 20 is different from the fin width w. Each silicon-containing material portion 20 includes a vacant portion of a cavity 19 that is laterally surrounded by vertical portions of the silicon-containing material portion 20.

In one embodiment, top portions of the silicon-containing material portions 20 can be faceted due to formation of facets during the selective epitaxy process. In one embodiment, the angle α of the facet, as measured relative to the vertical direction, can be greater than 90 degrees and less than 180 degrees. In another embodiment, the fin 20 may be tapered (thinner at top and thicker at bottom).

Referring to FIGS. 4A-4C, a second photoresist layer 27 can be applied over the hard mask layer 18 and the silicon-containing material portions 20, and can be lithographically patterned to physically expose end portions of each silicon-containing material portion 20, while covering a pair of vertical portions that are parallel to each other. In a non-limiting illustrative example, vertical portions having sidewalls that are parallel to the C-C' plane in FIG. 4A can be covered by the patterned second photoresist layer 27, and other vertical portions having sidewalls that are perpendicular to the C-C' can be physically exposed after the second photoresist layer 27 is patterned.

An etch process can be employed to etch the portions of the silicon-containing material portion 20 that are not covered by the second photoresist layer 27. The etch process can be an anisotropic etch process or an isotropic etch process. A wet etch or a dry etch can be employed for the etch process. The silicon-carbon alloy layer 14 can be employed as an etch stop layer or etch endpoint layer for the etch process that removes physically exposed portions of the silicon-containing material portions 20. A remaining portion of each silicon-containing material portion after the etch process can include a horizontal portion and a pair of semiconductor fins. The sidewalls of the second photoresist layer 27 and the lateral etch distance define the locations of end walls of the semiconductor fins. The end walls of semiconductor fins can be perpendicular to the pairs of sidewalls that define the semiconductor fins. The second photoresist layer 27 is subsequently removed, for example, by ashing.

Referring to FIGS. 5A-5C, the hard mask layer 18 can be removed selective to semiconductor materials of the silicon-containing material portions 20 and the silicon-carbon alloy layer. The removal of the hard mask layer 18 may be selective to the silicon-germanium alloy of the silicon-germanium alloy layer 16. In an illustrative example, if the hard mask layer 18 includes silicon oxide, the hard mask layer 18 can be removed by a wet etch employing hydrofluoric acid. If the hard mask layer 18 includes silicon nitride, the hard mask layer 18 can be removed by a wet etch employing hot phosphoric acid.

Subsequently, the silicon-germanium alloy layer 16 can be removed selective to the silicon-containing material portions 20, i.e., without removing the silicon-containing material portions 20. In one embodiment, the silicon-germanium alloy layer 16 may be removed selective to the silicon-carbon alloy layer 14. For example, the silicon-germanium alloy layer 16 can be removed by a wet etch chemical including a combination of hydrofluoric acid and hydrogen peroxide while the silicon-containing material portions 20 and the silicon-carbon alloy layer 14 are not etched by the wet etch chemical. In another embodiment the silicon-germanium alloy layer 16 can be removed by a gas phase etch containing hydrochloride while the silicon-containing material portions 20 and the silicon-carbon alloy layer 14 are not etched. Thus, the hard mask layer 18 and the silicon-germanium alloy layer 16 are removed selective to the silicon-containing material portions 20. In one embodiment, each silicon-containing material portion 20 can include a horizontal portion and a pair of semiconductor fins. Each silicon-containing material portion 20 can have a U-shaped vertical cross-sectional view along a plane that is perpendicular to the sidewalls that define semiconductor fins.

Referring to FIGS. 6A-6C, a dielectric spacer 30 including a dielectric material can be formed on sidewalls of each silicon-containing material portion 20. The dielectric spacer 30 includes an oxygen impermeable material. As used herein, an "oxygen-impermeable material" refers to a material having an oxygen permeability that is less than 10% of oxygen permeability of thermal silicon oxide in a temperature range from 20° C. to 1,000° C. In one embodiment, the dielectric spacer 30 can include an oxygen impermeable material having an oxygen permeability that is less than 0.1% of oxygen permeability of thermal silicon oxide in a temperature range from 20° C. to 1,000° C. In one embodiment, the dielectric spacer 30 includes silicon nitride or a dielectric metal nitride. The dielectric spacers 30 can be formed by deposition of a conformal dielectric material layer and an anisotropic etch process that removes horizontal portions of the conformal dielectric material layer. The conformal dielectric material layer can be deposited, for example, by chemical vapor deposition (CVD) or atomic layer deposition (ALD). The thickness of the conformal dielectric material layer is selected to be less than one half of the distance between adjacent pairs of semiconductor fins 20F. In one embodiment, the thickness of the conformal dielectric material layer can be in a range from 5 nm to 100 nm, although lesser and greater thicknesses can also be employed.

A top surface of the horizontal portion of each silicon-containing material portion 20 is physically exposed after formation of the dielectric spacers 30. Further, top surfaces of the vertical portions of the silicon-containing material portions 20, i.e., the semiconductor fins 20F, are physically exposed after formation of the dielectric spacers 30. The sidewall surfaces of the semiconductor fins 20F are covered with the dielectric spacers 30. In one embodiment, a single contiguous dielectric spacer 30 can contact two pairs of parallel sidewalls that belong to a pair of semiconductor fins within a silicon-containing material portion 20, and sidewalls of a horizontal portion of the silicon-containing material portion 20.

Figure 7C:
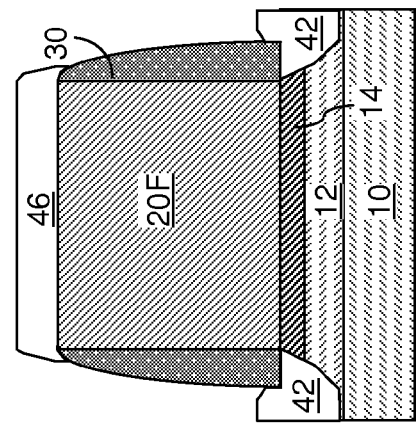
FIG. 7C is a vertical cross-sectional view of the exemplary semiconductor structure along the vertical plane C-C' of FIG. 7A.
Figure 7A:
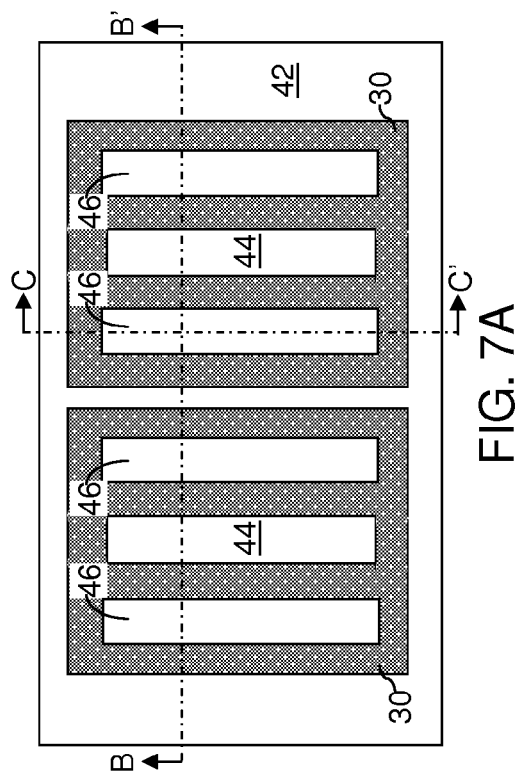
FIG. 7A is a top-down view of the exemplary semiconductor structure after conversion of surface portions of semiconductor materials into semiconductor oxide portions according to an embodiment of the present disclosure.
Figure 7B:
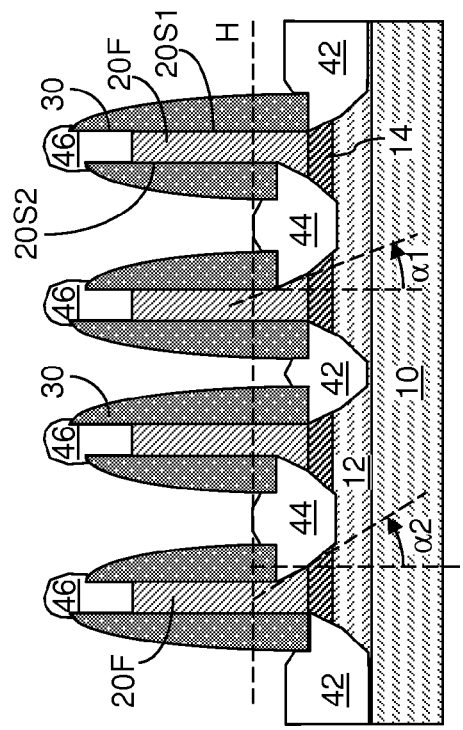
FIG. 7B is a vertical cross-sectional view of the exemplary semiconductor structure along the vertical plane B-B' of FIG. 7A.

Referring to FIGS. 7A-7C, surface portions of semiconductor materials having a physically exposed surface are converted into semiconductor oxide portions. The conversion of the surface portions of the semiconductor materials into semiconductor oxide materials can be performed, for example, by thermal oxidation, plasma oxidation, or implantation of oxygen into the surface portions of the various physically exposed semiconductor materials.

In one embodiment, thermal oxidation or plasma oxidation is performed to convert surface portions of semiconductor materials that are not covered by the dielectric spacers 30. In this case, the dielectric spacer 30 prevents diffusion of oxygen therethrough. Thus, a lower portion of each semiconductor fin 20F is prevented from oxidation by the dielectric spacer 30 that laterally surrounds the semiconductor fin 20F and prevents permeation of oxygen atoms during the thermal oxidation or plasma oxidation.

In another embodiment, oxygen implantation is employed to convert surface portions of semiconductor materials that are not covered by the dielectric spacer 30. The energy of ion implantation can be controlled such that the oxidized portion of the semiconductor material extends to the physically exposed surface of the implanted portion of the semiconductor material. The implantation depth of the ion implantation process is less than the height of each semiconductor fin 20F prior to implantation. In one embodiment, the implantation depth of the ion implantation process can be less than 25% of the height of each semiconductor fin 20F prior to implantation. In this case, the dielectric spacers 30 functions as a stopping material layer that prevents oxygen from reaching the portion of the silicon-carbon alloy layer 14 directly underneath the dielectric spacers 30.

The physically exposed upper portion of each semiconductor fin 20F is converted into a fin cap dielectric portion 46. Each fin cap dielectric portion 46 includes an oxide of the semiconductor material in the semiconductor fin 20F underneath. Each semiconductor fin 20F is a silicon-containing semiconductor fin, i.e., contains silicon. Each fin cap dielectric portion 46 laterally protrudes outward from vertical planes including sidewalls of the semiconductor fin 20F underneath. Each upper region of the semiconductor fins 20F, i.e., the vertical portions of the silicon-containing material portions 20, can be converted into a semiconductor oxide portion, i.e., a fin cap dielectric portion 46, while the dielectric spacers 30 are present.

The dielectric spacers 30 confine the lateral dimension of the lower portion of each fin cap dielectric portion 46. An upper portion of each fin cap dielectric portion 46 is formed above the topmost surfaces of the dielectric spacers 30. The upper portion of each fin cap dielectric portion 46 can laterally expand to a greater width than the lateral distance between a pair of vertical sidewalls of the lower portion of the fin cap dielectric portion 46. The lateral distance between the pair of vertical sidewalls of the lower portion of the fin cap dielectric portion 46 can be the same as the width of the underlying semiconductor fin 20F.

First shallow trench isolation regions 42 are formed by conversion of at least physically exposed regions of the silicon-carbon alloy layer 14 into a semiconductor oxide material, i.e., an oxide of a semiconductor material. The semiconductor oxide material of the first shallow trench isolation region 42 includes an oxide of an alloy of silicon and carbon. Each first shallow trench isolation region 42 contacts a remaining portion of the silicon-carbon alloy layer 14.

A lower portion of the each first shallow trench isolation structure 42 may, or may not, extend into an upper portion of the semiconductor substrate (10, 12). In one embodiment, the first shallow trench isolation regions 42 can be formed by oxidation of physically exposed regions of the silicon-carbon alloy layer 14 and underlying regions of the punchthrough stopper doping layer 12. In this case, an upper portion of each first shallow trench isolation structure 42 can include an oxide of an alloy of silicon and carbon. The upper portion is located above the horizontal plane including the interface between the silicon-carbon alloy layer 14 and the punchthrough stopper doping layer 12. The oxide of the alloy of silicon and carbon is derived from the oxidized portion of the silicon-carbon alloy of the silicon-carbon alloy layer 14 and the oxygen atoms introduced during an oxidation process or an oxygen implantation process. Further, a lower portion of each first shallow trench isolation structure 42 can include an oxide of a doped semiconductor material. The lower portion is located below the horizontal plane including the interface between the silicon-carbon alloy layer 14 and the punchthrough stopper doping layer 12. In one embodiment, the lower portion of each first shallow trench isolation structure 42 can include an oxide of doped silicon. The oxide of the doped semiconductor material is derived from the oxidized portion of the punchthrough stopper doping layer 12 and the oxygen atoms introduced during an oxidation process or an oxygen implantation process.

Within the lower portion of each first shallow trench isolation structure 42, the atomic concentration of carbon decreases with a vertical distance from the horizontal plane including the interfaces between the semiconductor fins 20F and the silicon-carbon alloy layer 14 toward the semiconductor substrate (10, 12). The p-type dopants or n-type dopants present in the punchthrough stopper doping layer 12 can diffuse upward within the first shallow trench isolation structures 42. In this case, within the upper portion of each first shallow trench isolation structure 42, the atomic concentration of electrical dopants (which are p-type dopants or n-type dopants) increases with a vertical distance from the horizontal plane including the interfaces between the semiconductor fins 20F and the silicon-carbon alloy layer 14 toward the semiconductor substrate (10, 12).

In one embodiment, the lateral extent of oxidation can be controlled such that the first shallow trench isolation structures 42 do not contact the semiconductor fins 20F. Further, the first shallow trench isolation structures 42 can be substantially free of germanium.

Second shallow trench isolation regions 44 can be formed by conversion of at least physically exposed regions of the horizontal portions of the silicon-containing material portions 20 (See FIGS. 6A-6C) into a semiconductor oxide material. The semiconductor oxide material of the second shallow trench isolation region 44 includes an oxide of a silicon-containing semiconductor material. Each second shallow trench isolation region 44 contacts remaining portions of the silicon-containing material portion 20 from which the second shallow trench isolation region 44 is derived. The remaining portions of the silicon-containing material portions 20 include a pair of semiconductor fins 20F that contact the second shallow trench isolation region 44 located therebetween.

Further, a lower portion of the each second shallow trench isolation structure 44 extends at least into an upper portion of the silicon-carbon alloy layer 14. The lower portion is located below the horizontal plane including the interface between the silicon-carbon alloy layer 14 and the semiconductor fins 20F. In one embodiment, the second shallow trench isolation regions 44 can be formed by oxidation of physically exposed regions of the horizontal portions of the silicon-containing material portions 20 and underlying regions of the silicon-carbon alloy layer 14. An upper portion of each second shallow trench isolation structure 44 includes an oxide of a silicon-containing semiconductor material. The upper portion is located above the horizontal plane including the interface between the silicon-carbon alloy layer 14 and the semiconductor fins 20F. In one embodiment, the upper portion of each second shallow trench isolation structure 44 can consist essentially of an undoped silicon oxide or a doped silicon oxide. The oxide of the silicon-containing semiconductor material is derived from the oxidized horizontal portion of the silicon-containing material portions 20 and the oxygen atoms introduced during an oxidation process or an oxygen implantation process. Further, a lower portion of each second shallow trench isolation structure 44 can include an oxide of an alloy of silicon and carbon. The oxide of the alloy of silicon and carbon is derived from the oxidized portion of the silicon-carbon alloy layer 14 and the oxygen atoms introduced during an oxidation process or an oxygen implantation process.

The lower portion of each second shallow trench isolation structure 44 includes an alloy of at least silicon and carbon. In one embodiment, the lower portion of each second shallow trench isolation structure 44 can consist essentially of an alloy of silicon and carbon. Within the lower portion of each second shallow trench isolation structure 44, the atomic concentration of silicon can decrease with a vertical distance from a horizontal plane H including a topmost surface of the second shallow trench isolation structure 44 toward the semiconductor substrate (10, 12). Within the upper portion of each second shallow trench isolation structure 44, the atomic concentration of carbon decreases with a vertical distance from the horizontal plane including the interface between the silicon-containing semiconductor fins 20F and the silicon-carbon alloy layer 14 away from the semiconductor substrate (10, 12).

The exemplary semiconductor structure includes at least a silicon-containing semiconductor fin, i.e., one of the semiconductor fins 20F, located on the silicon-carbon alloy layer 14. The silicon-containing semiconductor fin and the silicon-carbon alloy layer 14 are single crystalline and in epitaxial alignment with each other. A fin cap dielectric portion 46 is located above the top surface of the silicon-containing semiconductor fin, and includes an oxide of the semiconductor material in the silicon-containing semiconductor fin, and laterally protrudes outward from vertical planes including the sidewalls of the silicon-containing semiconductor fin.

A first sidewall 20S1 of the silicon-containing semiconductor fin is substantially vertical between the top surface of the silicon-containing semiconductor fin and the interface between the silicon-carbon alloy layer 14 and the silicon-containing semiconductor fin. A second sidewall 20S2 of the silicon-containing semiconductor fin includes a substantially vertical upper portion and a convex surface. In one embodiment, the convex surface can adjoin a bottom surface of the dielectric spacer at a non-orthogonal angle. The angle of the convex surface that contacts the bottom surface of the dielectric spacer 30, as measured from the vertical direction, is herein referred to as a first angle $\alpha 1$. Further, the convex surface contacts the interface between the silicon-carbon alloy layer 14 and the silicon-containing semiconductor fin at a non-orthogonal angle as measured from the vertical direction, which is herein referred to as a second angle $\alpha 2$. The second angle $\alpha 2$ is greater than the first angle $\alpha 1$.

A lower portion of the silicon-containing semiconductor fin has a variable width that decreases with a vertical distance from the interface between the silicon-carbon alloy layer 14 and the silicon-containing semiconductor fin. The upper portion of the silicon-containing semiconductor fin has a uniform width, which is the fin width w (See FIG. 3B). The uniform width of the upper portion of the silicon-containing semiconductor fin can be equal to, or can be less than, the minimum width of the lower portion of the silicon-containing semiconductor fin, which occurs at the topmost portion of the lower portion that adjoins the upper potion. If the uniform width of the upper portion of the silicon-containing semiconductor fin is less than the minimum width of the lower portion, the convex surface contacts the bottom surface of the dielectric spacer 30 and does not adjoin the second sidewall 20S2.

Referring to FIGS. 8A-8C, the dielectric spacers 30 are removed selective to semiconductor materials and the various semiconductor oxide portions. The various semiconductor oxide portions include the fin cap dielectric portions 46, the first shallow trench isolation structures 42, and the second shallow trench isolation structures 44. If the dielectric spacers 30 include silicon oxide, a wet etch including hot phosphoric acid may be employed to removed the dielectric spacers 30 selective to the semiconductor materials and the various semiconductor oxide portions (46, 42, 44). If the dielectric spacers 30 include a dielectric metal oxide, a wet etch chemistry selected to remove the dielectric metal oxide may be employed to removed the dielectric spacers 30 selective to the semiconductor materials and the various semiconductor oxide portions (46, 42, 44).

Figure 9C:
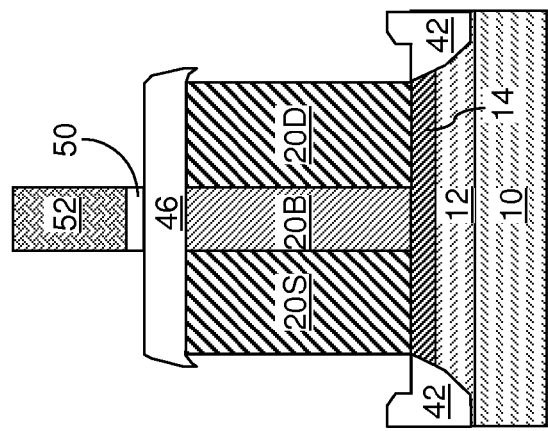
FIG. 9C is a vertical cross-sectional view of the exemplary semiconductor structure along the vertical plane C-C' of FIG. 9A.
Figure 9A:
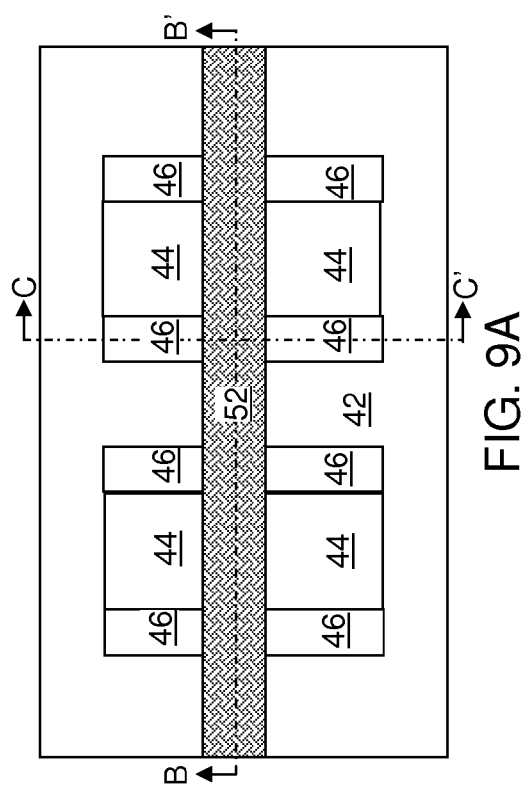
FIG. 9A is a top-down view of the exemplary semiconductor structure after formation of field effect transistors according to an embodiment of the present disclosure.
Figure 9B:
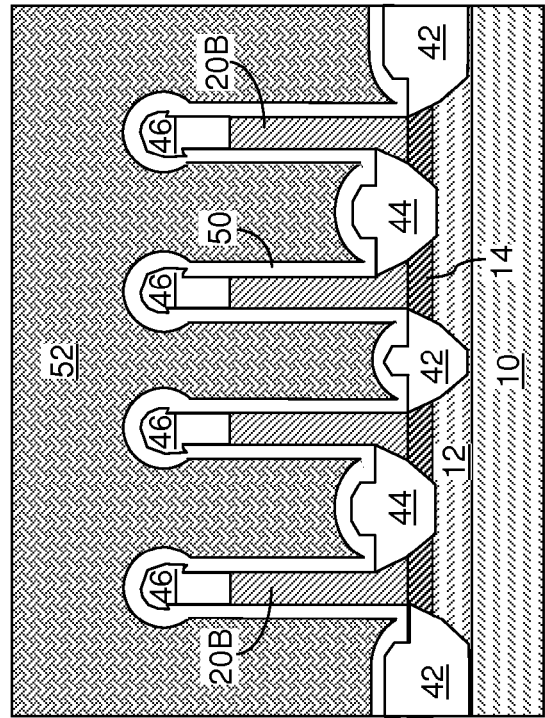
FIG. 9B is a vertical cross-sectional view of the exemplary semiconductor structure along the vertical plane B-B' of FIG. 9A.

Referring to FIGS. 9A-9C, a gate stack including a gate dielectric 50 and a gate electrode 52 can be formed across the vertical stacks including semiconductor fins 20F and the fin cap dielectric portions 46. Physically exposed portions of the semiconductor fins 20F can be doped with electrical dopants to form source regions 20S and drain regions 20D. The semiconductor fins 20F can be intrinsic or doped prior to formation of the source regions 20S and the drain regions 20D. If the semiconductors fins 20F includes a doped semiconductor material having a doping of a first conductivity type, which can be p-type or n-type, the source regions 20S and the drain regions have a doping of a second conductivity type, which is the opposite of the first conductivity type. The portions of the semiconductor fins 20F that remains intrinsic or retains the first conductivity type are herein referred to as body regions 20B.

Additional optional components of fin field effect transistors, such as dielectric gate spacers (not shown), epitaxially deposited raised source and drain regions (not shown), metal-semiconductor alloy regions (not shown) formed on the source regions 20S and the drain regions 20D, can be subsequently formed as needed. Further, a replacement gate integration scheme can be optionally employed to form replacement gate fin field effect transistors.

The embodiments of the present disclosure provides semiconductor fins having uniform height and electrically isolated by the first and second shallow trench isolation structures (42, 44), which are self-aligned to the semiconductor fins 20F. Thus, the embodiments of the present disclosure provides a process for forming various shallow trench isolation structures (42, 44) without lithographic patterning of the shallow trench shapes or anisotropic etch processes for etching shallow trenches.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:
1. A semiconductor structure comprising:
a silicon-carbon alloy layer located on a semiconductor substrate;
a silicon-containing semiconductor fin located on said silicon-carbon alloy layer, wherein said silicon-containing semiconductor fin and said silicon-carbon alloy layer are single crystalline and in epitaxial alignment with each other, and wherein a lower portion of said silicon-containing semiconductor fin has a variable width that decreases with a vertical distance from a horizontal plane including an interface between said silicon-carbon alloy layer and said silicon-containing semiconductor fin, and an upper portion of said silicon-containing semiconductor fin has a uniform width that is equal to a minimum width of said lower portion of said silicon-containing semiconductor fin; and
a shallow trench isolation structure contacting said silicon-containing semiconductor fin and said silicon-carbon alloy layer and including an oxide of a silicon-containing semiconductor material in an upper portion thereof.
2. The semiconductor structure of claim 1, wherein said shallow trench isolation structure includes a portion in which an atomic concentration of silicon decreases with a vertical distance from a horizontal plane including a topmost surface of said shallow trench isolation structure toward said semiconductor substrate.

3. The semiconductor structure of claim 2, wherein said shallow trench isolation structure includes another portion in which an atomic concentration of carbon decreases with a vertical distance from a horizontal plane including an interface between said silicon-containing semiconductor fin and said silicon-carbon alloy layer away from said semiconductor substrate.

4. The semiconductor structure of claim 1, wherein said shallow trench isolation structure further comprises an alloy of at least silicon and carbon in a lower portion thereof.

5. The semiconductor structure of claim 2, wherein said lower portion of said shallow trench isolation structure comprises an oxide of an alloy of silicon and carbon.

6. The semiconductor structure of claim 1, further comprising another shallow trench isolation structure in contact with said silicon-carbon alloy layer and comprising an oxide of an alloy of silicon and carbon in an upper portion thereof.

7. The semiconductor structure of claim 6, wherein a lower portion of said another shallow trench isolation structure extends into an upper portion of said semiconductor substrate.

8. The semiconductor structure of claim 7, wherein an atomic concentration of carbon decreases with a vertical distance from a horizontal plane including an interface between said silicon-containing semiconductor fin and said silicon-carbon alloy layer toward said semiconductor substrate within said lower portion of said another shallow trench isolation structure.

9. The semiconductor structure of claim 6, wherein said another shallow trench isolation structure is substantially free of germanium.

10. The semiconductor structure of claim 1, further comprising a fin cap dielectric portion comprising an oxide of a semiconductor material in said silicon-containing semiconductor fin and laterally protruding outward from vertical planes including sidewalls of said silicon-containing semiconductor fin.

11. The semiconductor structure of claim 1, wherein a first sidewall of said silicon-containing semiconductor fin is substantially vertical between an interface between said silicon-carbon alloy layer and said silicon-containing semiconductor fin and a top surface of said silicon-containing semiconductor fin, and a second sidewall of said silicon-containing semiconductor fin includes a substantially vertical upper portion and a convex surface that contacts said interface at a non-orthogonal angle.

12. A semiconductor structure comprising:
a silicon-carbon alloy layer located on a semiconductor substrate;
a silicon-containing semiconductor fin located on said silicon-carbon alloy layer, wherein said silicon-containing semiconductor fin and said silicon-carbon alloy layer are single crystalline and in epitaxial alignment with each other, and wherein a first sidewall of said silicon-containing semiconductor fin is substantially vertical between an interface between said silicon-carbon alloy layer and said silicon-containing semiconductor fin and a top surface of said silicon-containing semiconductor fin, and a second sidewall of said silicon-containing semiconductor fin includes a substantially vertical upper portion and a convex surface that contacts said interface at a non-orthogonal angle; and
a shallow trench isolation structure contacting said silicon-containing semiconductor fin and said silicon-carbon alloy layer and including an oxide of a silicon-containing semiconductor material in an upper portion thereof.

13. The semiconductor structure of claim 12, wherein said shallow trench isolation structure includes a portion in which an atomic concentration of silicon decreases with a vertical distance from a horizontal plane including a topmost surface of said shallow trench isolation structure toward said semiconductor substrate.

14. The semiconductor structure of claim 13, wherein said shallow trench isolation structure includes another portion in which an atomic concentration of carbon decreases with a vertical distance from a horizontal plane including an interface between said silicon-containing semiconductor fin and said silicon-carbon alloy layer away from said semiconductor substrate.

15. The semiconductor structure of claim 12, further comprising another shallow trench isolation structure in contact with said silicon-carbon alloy layer and comprising an oxide of an alloy of silicon and carbon in an upper portion thereof.

16. The semiconductor structure of claim 15, wherein a lower portion of said another shallow trench isolation structure extends into an upper portion of said semiconductor substrate.

17. The semiconductor structure of claim 12, further comprising a fin cap dielectric portion comprising an oxide of a semiconductor material in said silicon-containing semiconductor fin and laterally protruding outward from vertical planes including sidewalls of said silicon-containing semiconductor fin.

18. The semiconductor structure of claim 12, wherein a lower portion of said silicon-containing semiconductor fin has a variable width that decreases with a vertical distance from a horizontal plane including an interface between said silicon-carbon alloy layer and said silicon-containing semiconductor fin, and an upper portion of said silicon-containing semiconductor fin has a uniform width that is equal to a minimum width of said lower portion of said silicon-containing semiconductor fin.

\* \* \* \* \*